United States Patent [19]

Minuhin

[11] Patent Number: 4,754,225
[45] Date of Patent: Jun. 28, 1988

[54] PHASE COMPARATOR INSENSITIVE TO CLOCK ASYMMETRY

[75] Inventor: Vadim B. Minuhin, Bloomington, Minn.

[73] Assignee: Magnetic Peripherals Inc., Minneapolis, Minn.

[21] Appl. No.: 70,264

[22] Filed: Jul. 6, 1987

[51] Int. Cl.$^4$ .............................................. H03K 9/06
[52] U.S. Cl. .................................... 328/133; 328/134; 307/514; 307/516
[58] Field of Search ....................... 307/511, 514, 516; 328/133, 134, 155

[56] References Cited

U.S. PATENT DOCUMENTS

| | | | |
|---|---|---|---|
| 3,986,125 | 10/1976 | Eibner | 328/109 |
| 4,568,881 | 2/1986 | Kostrov | 328/109 |
| 4,656,431 | 4/1987 | Chapman | 328/134 X |

Primary Examiner—Eugene R. Laroche
Assistant Examiner—Steven J. Mottola
Attorney, Agent, or Firm—J. A. Genovese; R. M. Angus

[57] ABSTRACT

A phase comparator generates a reference pulse equal in duration to one bit cell, and a variable pulse having a duration representative of the duration and time displacement of the leading edge of a data pulse from the center of the bit cell. The phase comparator includes two D-type flip-flops arranged so that the variable pulse is initiated by the leading edge of the data pulse in the one bit cell, the reference pulse is initiated by the edge of the clock pulse at the end of the one bit cell, and both pulses are terminated by the edge of the clock pulse at the end of the next bit cell. Hence, only clock edges at the bounds of the bit cell affect the pulse durations and the apparatus is insensitive to clock asymmetry. The charge pump associated with the comparator provides a pump down signal amplitude equal to 3/2 the pump up signal amplitude to correct the relationship that the variable pulse (which generates the pump up signal) is 3/2 the duration of the reference pulse (which generates the pump down signal) where the data pulse edge is nominally in the center of the bit cell.

11 Claims, 3 Drawing Sheets

MAX LATE

MAX EARLY

NOMINAL

PHASE COMPARATOR INSENSITIVE TO CLOCK ASYMMETRY

This invention relates to phase comparators, and particularly to phase comparators and data recovery circuits which are insensitive to clock asymmetry.

Phase locked loops used in self-synchronizing digital recording systems typically include a data-phase comparator, charge pump, loop filter, and voltage controlled oscillator (VCO). The VCO provides a clock signal for data processing purposes. Additionally, the VCO provides a clock feedback to the data-phase comparator. The clock is used to detect the phase relationship between the encoded data (the encoded binary 1's) and the edges of the VCO clock signal. Any phase error between the data stream and clock signal drives the charge pump, which together with the loop filter, provides a DC signal to the VCO to adjust the phase and frequency of the oscillator. Ideally, the leading edge of the data pulse is at the center of the bit cell (detection window). However, because the data pulse may actually lead or lag the ideal or nominal condition, the detection window should be as large as possible, occupying as much of the bit cell as possible, so as to recover data located at any arbitrary position within the detection window.

U.S. Pat. No. 3,986,125 granted Oct. 12, 1976 to Eibner discloses a data-phase comparator useful with MFM (1,3) codes. However, the logic circuit of Eibner propagates unequal propagation delays resulting in detection windows which are less than the full width of the bit cell, especially at high frequencies (i.e., of the order of 100 MHz). U.S. Pat. No. 4,568,881 granted Feb. 4, 1986 to Kostrov, and assigned to the same assignee as the present application, overcomes many of the disadvantages of the Eibner circuit by eliminating the effects of cumulative gate propagation and set up delays through the various components of the data-phase comparator. As a result, Kostrov achieves a detection window equal to 100 percent of the bit cell, even at high frequencies (100 MHz). However, Kostrov requires a long cycle of operation and therefore can only operate if the encoded data stream has at least two 0's between each encoded 1 (2,7 code). Therefore, the Kostrov circuit will not operate with 1,7 or (1,3) codes.

Additionally, most prior data-phase comparators, including the Eibner and Kostrov comparators, operate on both the leading and trailing clock edges. As a result, the prior comparators required a perfectly symmetrical clock waveform, as asymmetry in the clock waveform increased error rate in the system. Achieving symmetrical clock waveforms is not an easy task, particularly at high frequencies (100 MHz), as the usual solution was to run the VCO at double frequency and dividing the frequency by two, hopefully creating a symmetrical clock. However, additional problems arose in attempts to maintain the VCO at such high frequencies.

It is an object of the present invention to provide a data-phase comparator which is insensitive to clock asymmetry.

Another object of the present invention is to provide a data-phase comparator having a detection window equal to 100% of the bit cell, even at high frequencies, and which is capable of detecting encoded data having only at least one encoded 0 between the encoded 1's (1,7 and 1,3 codes).

In accordance with the present invention, a phase comparator is provided which is responsive to an edge of the data signal and one edge (i.e., the leading edge) of successive clock signals to provide pump up and pump down pulses. At nominal conditions, the pump up and pump down signals provided by the comparator are of different duration, and are applied to the charge pump. The charge pump provides two different values of pump up and pump down currents which are inversely proportional to the nominal widths of the pump up and pump down pulses from the comparator. As a result, during nominal conditions, the total electric charge injected into the loop filter by each of the pump up and pump down conditions are equal and opposite.

One feature of the present invention resides in the provision that the comparator logic design eliminates the effects of cumulative gate propagation and set up delays through the various components of the phase comparator, thereby maximizing the detection window.

Another feature of the present invention resides in the fact that the comparator logic recovers to establish a detection window in at least alternate bit cells following a bit cell where an encoded 1 is detected.

Another feature of the present invention resides in the provision of the charge pump providing different current values to offset the unequal nominal lengths of the pump up and pump down signals.

Another feature of the present invention resides in the fact that the comparator logic is responsive solely to a single edge of successive clock signals, such as successive leading edges, so the operation of the phase comparator is independent of clock asymmetry.

The above and other features of this invention will be more fully understood from the following detailed description and the accompanying drawings, in which.

Figure 1:
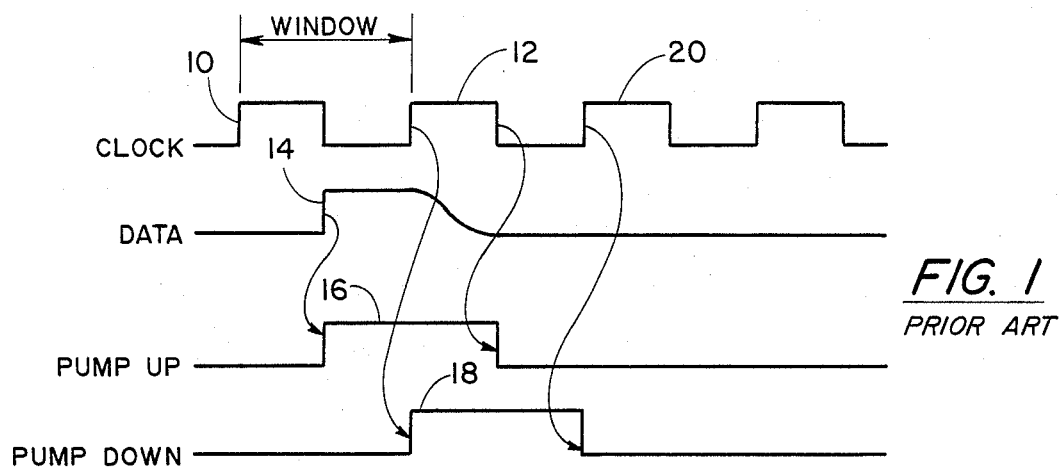
FIG. 1 depicts waveforms employed in prior data-phase comparators, particularly the Kostrov comparator.

Referring to FIG. 1, it is illustrated a series of waveforms illustrating the operation of the Kostrov comparator described in the aforementioned Kostrov patent. In particular, as shown in FIG. 1, the detection window is equal to the entire bit cell between the leading edges of successive clock pulses 10 and 12. Nominally, the leading edge of the data pulse 14 is centered in the bit cell and detection window, the leading edge of the data pulse 14 establishing the leading edge of the pump up pulse 16. The successive clock pulses are symmetrical so that the trailing edge of pulse 12 establishes the trailing edge of variable pump up pulse 16. The reference pump down signal 18 is established by the leading edges of the successive clock pulses 12 and 20. Nominally, the leading edge of the data pulse 14 is at the center of the detection window (coincident with the trailing edge of the clock pulse 10) so that the duration of the pump up signal 16 is, at nominal conditions, equal to the duration of the pump down signal 18. As the position of the data pulse 14 varies within the window established by the clock signal, the length of pump up pulse 16 will vary to a greater or lesser duration, depending upon the degree and direction of leading and lagging.

Figure 2:
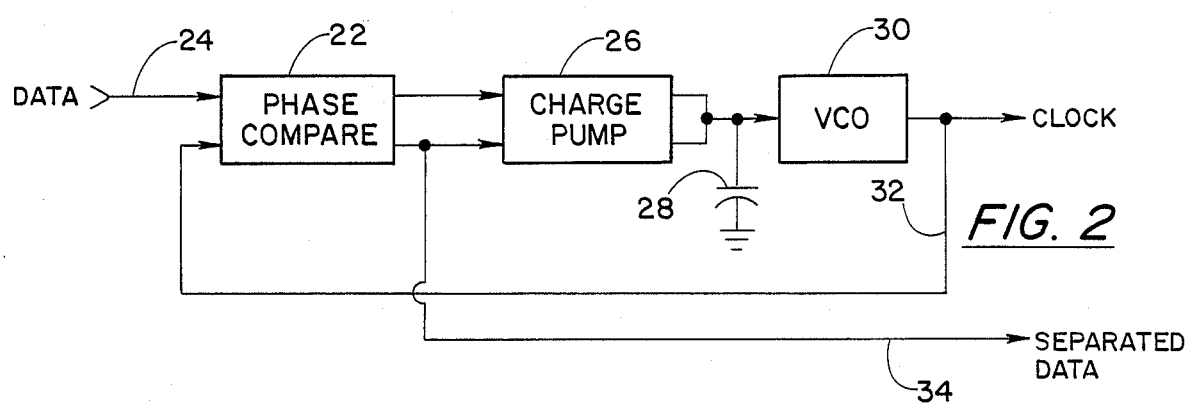
FIG. 2 is a block circuit diagram of a typical data-phase comparator, including the comparator of the present invention.

FIG. 2 illustrates a block diagram of a data-phase comparator and recovery circuit wherein a phase comparator 22 receives data via input 24 and provides pump up and pump down signals to charge pump 26. Charge pump 26 provides a voltage to filter 28 to operate voltage controlled oscillator (VCO) 30. VCO 30 provides a clock signal on output 32 for the system, as well as a feedback to phase comparator 22. Separated data is taken via output 34.

In operation of the present invention, the detection window is established between the leading edges of successive clock pulses 40, 42, 44, and therefore encompasses the entire bit cell. However, unlike prior comparators, the successive clock pulses need not have duty cycles equal to 50 percent of the bit cell, and need not be equal in duration. Thus, as shown in the drawing, the clock pulses are asymmetrical. Nominally, a data pulse 46 will have its leading edge centered in the window established by leading edges of successive clock pulses. Like the Eibner and Kostrov comparators, the variable pump up pulse 48 has its leading edge established by the edge of data pulse 46. Unlike Eibner, the leading and trailing edges of the reference pump down pulse 50 are established by the leading edges of successive clock pulses 42 and 44. Unlike Kostrov, the trailing edge of variable pump up pulse 48 is also established by the leading edge of clock pulse 44.

Figure 3:
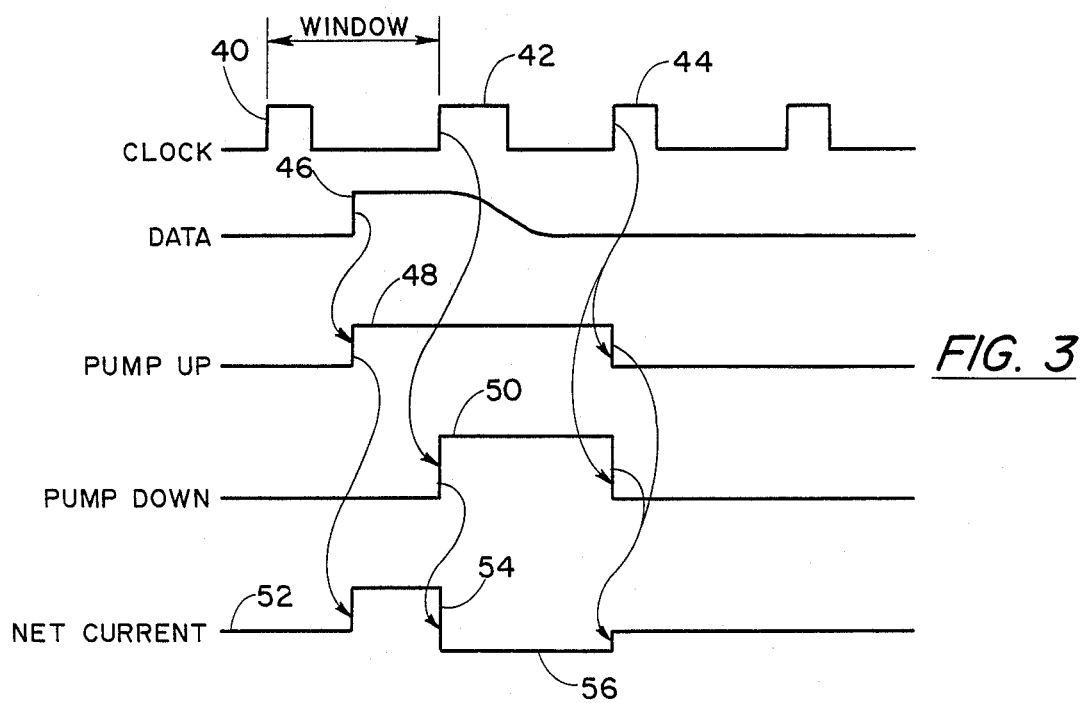
FIG. 3 depicts waveforms useful in explaining and distinguishing the operation of the present invention from that of the prior art.

It can be viewed by an inspection of the duration of the pump up pulse 48 and pump down pulse 50 in FIG. 3 that nominally the pump up pulse is 1.5 times the duration of the pump down pulse. Therefore, in accordance with the present invention, charge pump 26 provides a negative pump down current which is 1.5 times the positive pump up current. Therefore, the net current to filter 28 and VCO 30 for nominal conditions is illustrated by waveform 52 and includes a pulse 54 having a positive current I for one-half bit cell followed by a negative pulse 56 having a negative current of one-half I for a full cell. The net electric charge, therefore, is zero.

Figure 4:
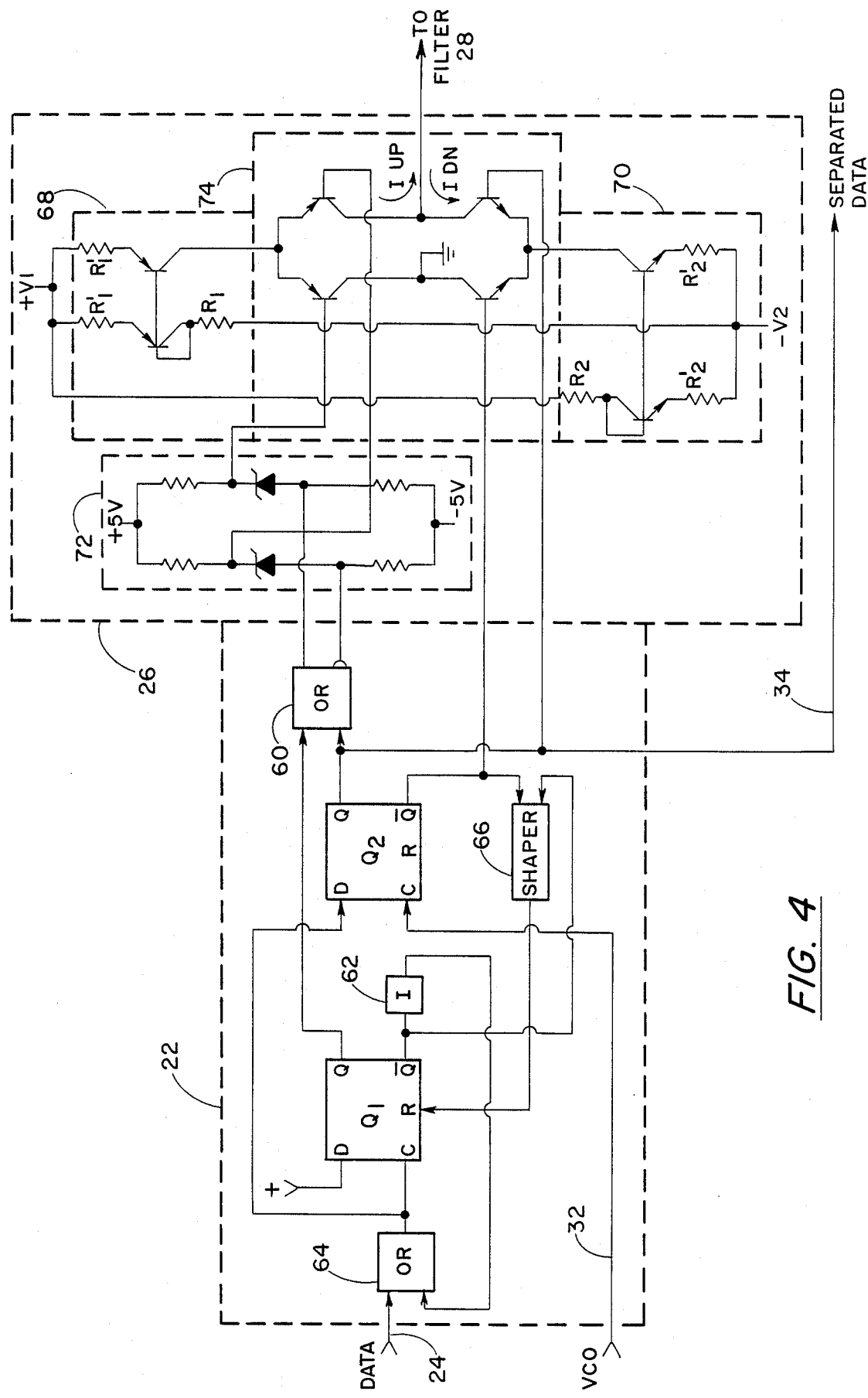
FIG. 4 is a block circuit diagram of a phase comparator and charge pump in accordance with the presently preferred embodiment of the present invention.

FIG. 4 illustrates a detailed block circuit diagram of the phase comparator 22 and charge pump 26 shown in FIG. 2. Comparator 22 comprises a first D-type flip-flop Q1 and a second D-type flip-flop Q2. The D input of flip-flop Q1 is connected to a source of high signal, whereas the clock input of flip-flop Q1 and the D input of flip-flop Q2 are connected through OR gate 64 to input 24 to receive data signals (i.e., pulses 46 in FIG. 3). The Q output of flip-flop Q1 is provided as one input to OR gate 60, whereas the Q-not output of flip-flop Q1 is provided through inverter 62 to the second input of OR gate 64. The clock input of flip-flop Q2 is connected to the output of VCO 30 via lead 32. The Q output of flip-flop Q2 is connected as a second input to OR gate 60, and the Q-not output of flip-flops Q1 and Q2 are provided to pulse shaper 66 to the overriding reset input of flip-flop Q1.

Charge pump 26 includes a source 68 of positive current and a source 70 of negative current. Source 68 comprises a pair of complementary pnp transistors each connected through a resistor R1' to a positive source (+V1) of voltage (such as +15 volts), and through resistor R1 to the negative source (−V2) of voltage (such as −15 volts). Source 70 comprises a pair of npn transistors connected to the negative source through resistors R2' and through resistor R2 to the positive source. The relationship of the resistors is such that (R1+R1') equals 3/2 (R2+R2'). Due to this relationship, amplitudes of the pump up current from source 68 and the pump down current from source 70 are the inverse of the relationship of the resistors: I up equals 2/3 I down.

Complementary logic signals from OR gate 60 are provided to level shifter 72 to translate standard emitter-coupled logic levels from OR gate 60 to the levels necessary for operation of one set of the transistor pairs of switch 74. Switch 74 includes a pair of pnp transistors receiving complementary logic signals from logic level shifter 72 and includes a second pair of npn transistors connected to receive complementary logic signals from the Q and Q-not outputs of flip-flop Q2. Switch 74 operates to pass the Iup and Idown currents for the duration of the pump up and pump down pulses provided by OR gate 60 and flip-flop Q2.

Figure 5C:
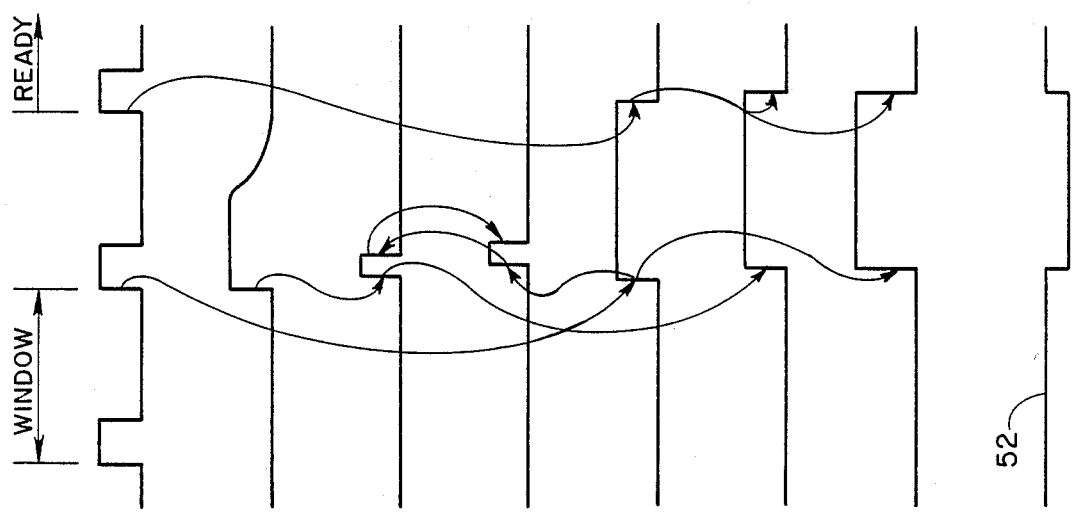
FIGS. 5A, 5B and 5C depict various waveforms useful in explaining the operation of the circuit illustrated in FIG. 4.
Figure 5B:
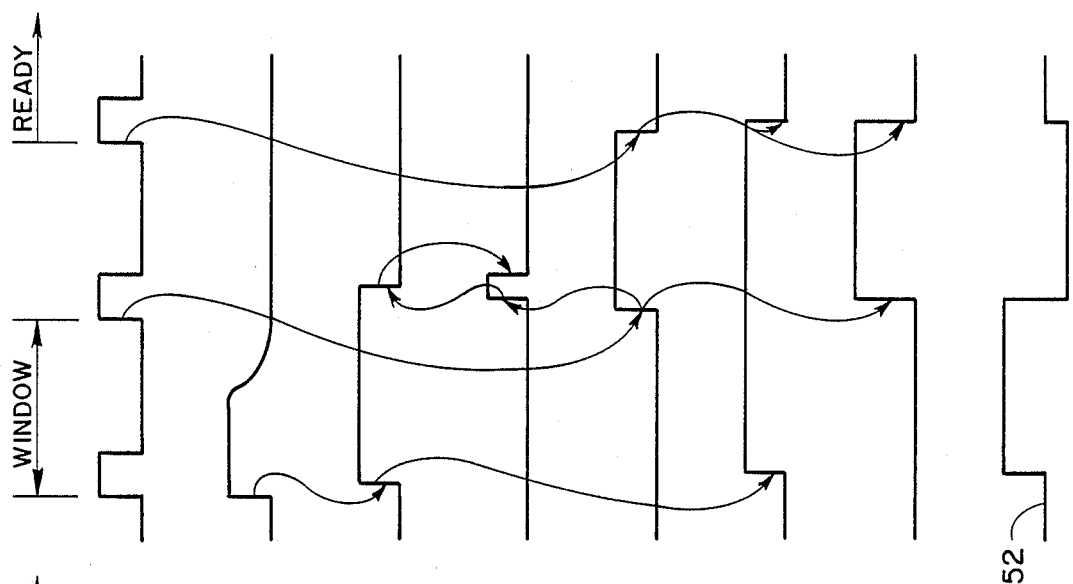
Figure 5A:
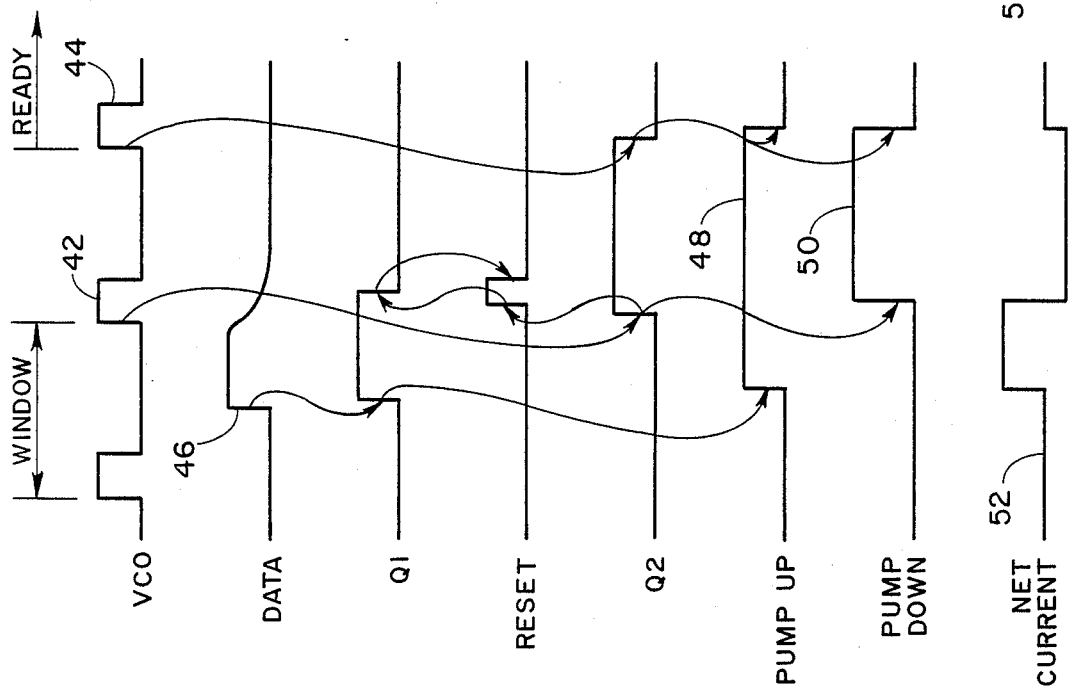

With reference particularly to FIGS. 4 and 5, the operation of the phase comparator may be explained. At the beginning of each operational cycle, flip-flop Q1 is in its low state so the Q-not output is high and inverter 62 provides a low input to OR gate 64. Hence, OR gate 64 is ready to respond to a data pulse. Referring first to FIGS. 4 and 5A, a data pulse having a leading edge 46 arrives through OR gate 64 at the clock input of flip-flip Q1 and at the D input of flip-flop Q2. Since the D input is always high, flip-flip Q1 sets its Q output high to provide an input to OR gate 60. As Q1 goes high, OR gate 60 is operated to set the pump up signal pulse 48 high. Also, as Q1 goes high, the Q-not output of flip-flop Q1 goes low, which is inverted by inverter 62 to drive OR gate 64 to maintain the D input of flip-flip Q2 high. Upon receipt of the leading edge of the next clock pulse 42 at the clock input of flip-flop Q2, the Q output of flip-flop Q2 goes high. The high Q output of flip-flop Q2 operates through OR gate 60 to maintain the pump up signal pulse 48 high, and sets the pump down pulse 50 high. At the same time, the Q-not output of flip-flop Q2 goes low to operate pulse shaper 66 to reset flip-flop Q1 to a low condition, thereby clearing the high input to the D input of flip-flop Q2. (If the data pulse has not yet gone low, the D input of Q2 will remain high until it does.) Conveniently, pulse shaper 66 may be a NOR gate operable to supply a reset signal to flip-flop Q1 when both inputs to the gate 66 are low. Upon reset of flip-flop Q1, its Q-not output goes high to provide a high input to NOR gate 66 to drive the reset signal low. Upon the next leading edge of clock pulse 44, the data pulse has gone low thereby removing the high D input from flip-flop Q2, and flip-flop Q2 is set low, thereby driving both the pump up and pump down signals low. Due to the relationship of the charge pump described above, the pump down signal amplitude is 3/2 the amplitude of the pump up signal. The net current is illustrated at waveform 52.

FIG. 5A illustrates the waveforms for a nominal condition where the leading edge of the data pulse is in the center of the window. FIG. 5B illustrates the waveforms associated where the data pulse is at the beginning of the window, whereas FIG. 5C illustrates the waveforms where the data pulse is at the end of the window. Inspection of the waveforms 52 of each of FIGS. 5A, 5B, and 5C reveals that in the nominal condition the net current is zero, whereas in the early condition the is positive and in the late condition the net current is negative. The net current is used to drive the VCO to adjust the clock frequency.

The propagation delay in setting the pump down signal is equal to the propagation delay from the clock input to the Q output of flip-flop Q2. The propagation delay to terminate the pump down signal is equal to the propagation delay from the clock input to the Q output of flip-flop Q2. The pump down signal will be equal in duration to the clock cycle as measured between from the leading edges of successive clock pulses, minus the propagation delay to set the pump down signal plus the propagation delay to terminate the pump down signal. Since the two propagation delays are equal, their effects are cancelled and the pump down signal will always equal the clock cycle.

The propagation delay in setting the variable pump up signal is equal to the propagation delay from the clock input to the Q output of flip-flop Q1, plus the propagation delay through OR gate 60 and with the propagation delay in terminating the pump up signal equals the propagation delay from the clock input to the Q output of flip-flop Q2, plus the propagation delay through OR gate 60. Since the flip-flops are configured on a single chip, the propagation delays for each flip-flop are equal. Hence, the variable pump-up signal will be equal in duration to the duration between the leading edge of the data pulse and the leading edge of the successive clock pulse in the cell following the cell in which the input pulse occurred, minus the propagation delay to set up the pump-up signal, plus the propagation delay to terminate the pump-up signal. Since the two propagation delays are equal, their effects are cancelled and the duration of the pump-up signal will always equal the time between the leading edge of the data pulse and the leading edge of the clock pulse in the bit cell next following that in which the data pulse occurred.

One feature of the present invention resides in the fact that flip-flop Q1 is reset to its low state by the leading edge of the clock pulse at the end of the bit cell containing the data pulse (by setting flip-flop Q2 high to drive NOR gate 66 to reset flip-flop Q1). As a result, the phase comparator according to the present invention is ready to respond to data pulses in the bit cell beginning with the next clock leading edge following reset of flip-flop Q1. Consequently, the apparatus is capable of responding to codes with only one 0 between successive encoded 1's, such as (1,3) and (1,7) codes.

Another feature of the present invention resides in the fact that the simultaneous appearance of the clock pulse at the clock input of flip-flop Q1 and D input of flip-flop Q2 permits independent and simultaneous operation of both flip-flop if the data pulse is maximally late at the edge of the clock pulse (FIG. 5C). Hence, in the maximum late condition, flip-flop Q1 is operated by the edge of the data pulse and flip-flop Q2 is operated by the clock pulse. As a result, the data pulse may appear anywhere in the bit cell, to the leading edges of the clock pulse, thereby ensuring a detection window equal to 100% of the bit cell.

This invention therefore provides an effective phase comparator and data separator capable of achieving the advantages of the Kostrov system, yet operate with asymmetric clock pulses and with a greater number of codes.

This invention is not to be limited by the embodiment shown in the drawings and described in the description, which is given by way of example and not of limitation, but only in accordance with the scope of the appended claims.

What is claimed is:

1. A phase comparator responsive to an input pulse stream and a clock pulse stream, said clock pulse stream having a succession of clock pulse leading edges defining leading and trailing bounds of successive bit cells, said input pulse stream having a succession of input pulse leading edges, said phase comparator producing in response to the leading edge of each pulse of said input pulse stream a reference pulse having a duration equal to one bit cell and a variable pulse having a duration which is representative of direction and time displacement of the leading edge of the input pulse from the center of the bit cell in which the input pulses occurs, said phase comparator comprising:

means responsive to the edge of an input pulse occurring in one bit cell for initiating a variable pulse;

means responsive to the edge of a clock pulse occurring at the trailing bound of said one bit cell for initiating a reference pulse, and means responsive to the edge of a clock pulse occurring at the trailing bound of the bit cell next following said one bit cell for terminating said variable pulse and said reference pulse.

2. Apparatus according to claim 1 further including charge pump means responsive to said variable pulse and to said reference pulse for supplying an output signal to an output, said charge pump means including a first source for producing a first signal amplitude and a second source for producing a second signal amplitude, said second signal amplitude being greater than said first signal amplitude, first switch means connected to said first source and responsive to said variable pulse for connecting said first signal amplitude to said output, and second switch means connected to said second source and responsive to said reference pulse for connecting said second signal amplitude to said output.

3. Apparatus according to claim 2 wherein said second signal amplitude is 3/2 the value of said first signal amplitude.

4. Apparatus according to claim 1 wherein said means responsive to the edge of an pulse comprises a first bistable means which switches from a first state to a second state in response to the edge of said input pulse to initiate said variable pulse.

5. Apparatus according to claim 4 wherein said means responsive to the edge of a clock pulse occurring at the trailing bound of said one bit cell comprises a second bistable means which switches from a first state to a second state in response to the edge of a clock pulse at the trailing bound of said one bit cell to maintain said variable pulse and initiate said reference pulse and reset said first bistable means.

6. Apparatus according to claim 5 wherein said means responsive to the edge of a clock pulse occurring at the trailing bound of said bit cell next following said one bit cell comprises said second bistable means which switches from its second state to its first state in response to the edge of a clock pulse following reset of said first bistable means to terminate said variable pulse and said reference pulse.

7. Apparatus according to claim 6 further including charge pump means responsive to said variable pulse and to said reference pulse for supplying an output signal to an output, said charge pump means including a first source for producing a first signal amplitude and a second source for producing a second signal amplitude, said second signal amplitude being greater than said first signal amplitude, first switch means connected to said first source and responsive to said variable pulse for connecting said first signal amplitude to said output, and second switch means connected to said second source and responsive to said reference pulse for connecting said second signal amplitude to said output.

8. Apparatus according to claim 7 wherein said second signal amplitude is 3/2 the value of said first signal amplitude.

9. A phase comparator responsive to an input pulse stream and a clock pulse signal, said clock pulse signal having a succession of clock pulse leading edges defining leading and trailing bounds of successive bit cells, said input pulse stream having a succession of input pulse leading edges, said phase comparator producing in response to the leading edge of each input pulse a reference pulse having a duration equal to one bit cell and a variable pulse having a duration which is representative of direction and time displacement of the leading edge of the input pulse from the center of the bit cell in which the input pulse occurs, said phase comparator comprising:

first D-type flip-flop means having a clock input connected to receive said pulse stream, having a D input connected to a source, having a reset input, having a Q output and having a Q-not output;

second D-type flip-flop means having a clock input connected to receive said clock pulse signal, having a D input connected to receive a signal from the Q-not output of said first flip-flop, having a Q output, and having a Q-not output connected to the reset input of said first flip-flop, said second flip-flop output providing said reference pulse; and OR gate means connected to the Q outputs of said first and second flip-flops for providing said variable pulse.

10. Apparatus according to claim 9 further including charge pump means responsive to said variable pulse and to said reference pulse for supplying an output signal to an output, said charge pump means including a first source for producing a first signal amplitude and a second source for producing a second signal amplitude, said second signal amplitude being greater than said first signal amplitude, first switch means connected to said first source and responsive to said variable pulse for connecting said first signal amplitude to said output, and second switch means connected to said second source and responsive to said reference pulse for connecting said second signal amplitude to said output.

11. Apparatus according to claim 10 wherein said second signal amplitude is 3/2 the value of said first signal amplitude.

* * * * *